United States Patent [19]

Beever et al.

[11] Patent Number: 4,514,588

[45] Date of Patent: Apr. 30, 1985

[54] ENCAPSULATED ELECTRONIC COMPONENTS AND ENCAPSULATION COMPOSITIONS

[75] Inventors: William H. Beever; Robert S. Shue; Clifford W. Childers, all of Bartlesville, Okla.

[73] Assignee: Phillips Petroleum Company, Bartlesville, Okla.

[21] Appl. No.: 453,973

[22] Filed: Dec. 28, 1982

[51] Int. Cl.³ .......................... B29C 6/00; C08L 91/00
[52] U.S. Cl. ........................... 174/52 PE; 264/272.11; 264/272.16; 264/272.17; 264/272.18; 524/261; 524/423; 524/451; 524/456; 524/505; 361/331; 525/90; 525/189; 525/901
[58] Field of Search .......................... 525/901, 90, 189; 361/331; 174/52 PE; 524/348, 456, 261, 451, 505, 423; 264/272.11, 272.16–272.18

[56] References Cited

U.S. PATENT DOCUMENTS

| | | | |
|---|---|---|---|
| 4,309,514 | 1/1982 | Lee | 525/92 |
| 4,322,507 | 3/1982 | Haaf | 525/92 |
| 4,332,590 | 6/1982 | Smith | 436/55 |
| 4,337,182 | 6/1982 | Needham | 523/212 |
| 4,370,292 | 1/1983 | Yanase et al. | 525/474 |
| 4,436,865 | 3/1984 | Beever | 524/50 X |

FOREIGN PATENT DOCUMENTS 118456  9/1981  Japan .

OTHER PUBLICATIONS

Derwent Abst. 82546 E/39 (J57135859) 8-1982.
Derwent Abst. 20580 (J57021844) 2-1982.
Derwent Abst. 42553 K/18 (J58049749) 3-1983.
Derwent Abst. 52624 K/22 (J58067752) 4-1983.
Derwent Abst. 29924 E/15 (J57040557) 3-1982.

*Primary Examiner*—Herbert J. Lilling

[57] ABSTRACT

Electronic components are encapsulated with a poly(arylene sulfide) composition containing hydrogenated conjugated diene/monovinyl-substituted aromatic copolymer. The invention also includes certain encapsulation compositions containing poly(arylene sulfide), hydrogenated conjugated diene/monovinyl-substituted aromatic copolymer, reinforcement and filler.

51 Claims, No Drawings

ENCAPSULATED ELECTRONIC COMPONENTS AND ENCAPSULATION COMPOSITIONS

This invention relates to the encapsulation of electronic components. This invention also relates to encapsulation compositions.

BACKGROUND AND OBJECTS

The encapsulation of electronic components represents an art in and of itself. Electronic components are encapsulated to maintain electrical insulation, to provide mechanical protection and to otherwise shield the component from exposure to its environment. As the evolution of electronics continues its rapid advance it becomes increasingly important that the art and technology of encapsulation keep pace. An area of significant concern and interest relates specifically to the compositions used to encapsulate electronic components. There is an on-going effort to discover new and improved encapsulation materials. The present invention represents a contribution to that effort.

A relatively recent development has been the use of poly(arylene sulfide) compositions such as, for example, poly(phenylene sulfide) compositions, as encapsulating materials.

It is an object of this invention to provide encapsulation compositions having improved properties such as, for example, improved electric yield and improved non-electrical performance properties.

It is another object of this invention to provide electronic components encapsulated with improved poly(arylene sulfide) compositions.

These objects and other objects and advantages will be apparent upon reading this disclosure and the appended claims.

BRIEF SUMMARY OF THE INVENTION

In accordance with this invention an electronic component is encapsulated with a composition containing poly(arylene sulfide) and hydrogenated conjugated diene/monovinyl-substituted aromatic copolymer. This invention also includes certain encapsulation compositions that are especially well suited for the encapsulation of electronic components. This invention is further, and more completely, described in the disclosure that follows.

DESCRIPTION OF THE INVENTION

1. Article of Manufacture

The article of manufacture of this invention is an electronic component encapsulated with a composition containing poly(arylene sulfide) and hydrogenated conjugated diene/monovinyl-substituted aromatic copolymer.

For the purposes of this disclosure and the appended claims the term poly(arylene sulfide) is intended to designate arylene sulfide polymers. Uncured or partially cured poly(arylene sulfide) polymers whether homopolymer, copolymer, terpolymer, and the like, or a blend of such polymers, can be used in the practice of my invention. The uncured or partially cured polymer is a polymer the molecular weight of which can be increased by either lengthening of a molecular chain or by crosslinking or by combination of both by supplying thereto sufficient energy, such as heat. Suitable poly(arylene sulfide) polymers include, but are not limited to, those described in U.S. Pat. No. 3,354,129, incorporated by reference herein.

Some examples of poly(arylene sulfide) compositions suitable for the purposes of my invention include poly(2,4-tolylene sulfide), poly(4,4'-biphenylene sulfide) and poly(phenylene sulfide). Because of its availability and desirable properties (such as high chemical resistance, nonflammability, and high strength and hardness) poly(phenylene sulfide) is the presently preferred poly(arylene sulfide). Accordingly, poly(phenylene sulfide) compositions are the preferred encapsulation compositions of my invention.

In accordance with this invention electronic components are encapsulated with a poly(arylene sulfide) composition (such as, for example, a poly(phenylene sulfide) composition) containing a hydrogenated conjugated diene/monovinyl-substituted aromatic copolymer. The poly(arylene sulfide) composition can be, but is not required to be, a mixture of more than one type of poly(arylene sulfide). The poly(arylene sulfide) composition can contain, in addition to the above hydrogenated copolymer, other components although the broad concept of our invention is not limited thereto.

Our invention also includes electronic components encapsulated with more detailed poly(arylene sulfide) compositions which are especially well suited for successful use as encapsulation compositions. These compositions are described later in this disclosure.

The conjugated diene/monovinyl-substituted aromatic copolymers which can be hydrogenated to suit the purpose of this invention include those described in U.S. Pat. No. 3,595,942, U.S. Pat. No. 3,639,517 and U.S. Pat. No. 4,091,053. The disclosure provided by these patents is incorporated by reference herein. The copolymers can be random copolymers or block copolymers. The copolymers can be linear or radial (branched) copolymers. The monovinyl-substituted aromatic content of the copolymer can range from about 10 to about 90 weight percent based upon the total weight of the copolymer.

Examples of conjugated dienes that may be employed as monomers in the preparation of a suitable copolymer are 1,3-butadiene, isoprene, 2,3-dimethyl-1,3-butadiene, piperylene, 3-butyl-1,3-octadiene and phenyl-1,3-butadiene. Mixtures of conjugated dienes may be employed.

Examples of suitable monovinyl-substituted aromatic monomers include styrene, 3-methylstyrene, 4-n-propylstyrene, 4-cyclohexylstyrene, 4-dodecylstyrene, 2-ethyl-4-benzylstyrene, 4-p-tolylstyrene, 4-(4-phenyl-n-butyl)styrene, 1-vinylnaphthalene and 2-vinylnaphthalene. The monovinyl-substituted aromatic hydrocarbon can contain alkyl, cycloalkyl and aryl substituents and combinations thereof such as alkylaryl. Mixtures of monovinyl-substituted aromatic monomers may be employed.

The preferred copolymers are 1,3-butadiene/styrene copolymer and isoprene/styrene copolymer. These copolymers are preferred because very good results have been obtained with them.

Hydrogenation of conjugated diene/monovinyl-substituted aromatic copolymers is known in the art. Although this invention is not limited thereto, suitable hydrogenation procedures are described in U.S. Pat. No. 4,088,626, incorporated by reference herein. The objective of the hydrogenation is to hydrogenate aliphatic double bond unsaturation present in the copolymer. It is not an objective of the hydrogenation to hydrogenate aromatic double bond unsaturation present in the copolymer. In one embodiment of this invention at least about 80 percent of the aliphatic double bonds present in the copolymer prior to hydrogenation are hydrogenated. Thus this hydrogenated copolymer is characterized by at least about 80 percent aliphatic double bond hydrogenation. In accordance with the above embodiment of this invention the hydrogenated copolymer can be further characterized by less than about 25 percent aromatic double bond hydrogenation (i.e. less than about 25 percent of the aromatic double bonds present in the copolymer prior to hydrogenation are hydrogenated). Good results can be obtained using a hydrogenated copolymer characterized by at least about 99 percent aliphatic double bond hydrogenation and less than about 5 percent aromatic double bond hydrogenation.

The molecular weight of the hydrogenated copolymer can vary widely. Although this invention is not limited thereto, the weight average molecular weight of the hydrogenated copolymer can range from about 25,000 to about 350,000.

The electronic components to be encapsulated in accordance with my invention broadly include all electronic components (i.e. devices, parts, etc.) for which encapsulation is desired. The term electronic component is intended to be broadly construed and includes, by way of non-limiting example, the following:

capacitors,
resistors,
resistors networks,
integrated circuits,
transistors,
diodes,
triodes,
thyristors,
coils,
varistors,
connectors,
condensers,
transducers,
crystal oscillators,
fuses,
rectifiers,
power supplies, and
microswitches.

The definition of each of the above-identified electronic components is similarly intended to be broad and comprehensive. The term integrated circuit, for example, is intended to include, but is not limited to large scale integrated circuits,
TTL (transistor transistor logic),
hybrid integrated circuits,
linear amplifiers,
operational amplifiers,
instrumentation amplifiers,
isolation amplifiers,
multipliers and dividers,
log/antilog amplifiers,
RMS-to-DC converters,
voltage references,
transducers,
conditioners,
instrumentation,
digital-to-analog converters,
analog-to-digital converters,
voltage/frequency converters,
synchro-digital converters,
sample/track-hold amplifiers,
CMOS switches and multiplexers,
data-acquisition subsystems,
power supplies,
memory integrated circuits,
microprocessors,
and so on.

The scope of this invention broadly allows the inclusion of fillers and reinforcements in the encapsulation composition. Fillers can be used to improve the dimensional stability, thermal conductivity and mechanical strength of the composition. Some suitable fillers include, for example, talc, silica, clay, alumina, calcium sulfate, calcium carbonate, mica and so on. The fillers can be in the form of, for example, powder, grain or fiber. In selecting a filler the following factors should be considered:

(1) the electrical conductivity of the filler (the lower the better);
(2) the thermal stability of the filler at encapsulation temperatures; and
(3) the level of ionic impurities in the filler.

Suitable reinforcements include fibers of glass or calcium silicate (e.g. wollastonite). Examples of other reinforcements include glass or calcium silicate in nonfibrous form (e.g. beads, powders, grains, etc.) and fibers of other materials such as asbestos, ceramics, etc.

Although this invention is not limited thereto, the amount of hydrogenated conjugated diene/monovinyl-substituted aromatic copolymer in a composition containing poly(arylene sulfide), reinforcement and filler should generally be about 0.1 to about 10 weight percent based upon the total weight of hydrogenated copolymer, poly(arylene sulfide), reinforcement and filler. The range we suggest for practice of the invention is about 0.5 to about 5 weight percent.

Besides reinforcements and fillers the compositions can optionally contain relatively small amounts of other ingredients such as, for example, pigments, flow improvers, and processing aids.

The electrical resistance and hydrolytic stability of the encapsulation compositions of this invention can be improved by the addition of an organosilane. Many suitable organosilanes are known in the art. Good results can be obtained with, for example, N-{2-[3-(trimethoxysilyl)propylamino]ethyl}-p-vinylbenzylammonium chloride. Mercaptosilanes can also be used for this purpose. 3-Mercaptopropyltrimethoxysilane, $HSCH_2CH_2CH_2Si(OCH_3)_3$, is most preferred because of its high utility in improving electrical resistance and hydrolytic stability.

It should be noted that the first list of electronic components includes both active components (such as, for example, integrated circuits, transistors and diodes) and passive components (such as, for example, capacitors, resistors and resistor networks). The distinction is frequently important and is often determinative of the type of poly(arylene sulfide) encapsulation composition best suited for encapsulation of the component.

These more detailed poly(arylene sulfide) compositions, which are especially well suited for successful use as encapsulation compositions, broadly comprise the following:

(a) poly(arylene sulfide),
(b) hydrogenated conjugated diene/monovinyl-substituted aromatic copolymer,
(c) reinforcement, and
(d) filler.

These compositions can optionally contain, in addition to (a), (b), (c) and (d) above, relatively small amounts of other components such as, for example, organosilanes, pigments, flow improvers and processing aids.

2. Compositions for the Encapsulation of Active Components

Compositions used for the encapsulation of active components can be prepared in accordance with the following weight percentages:

(a) Poly(arylene sulfide): about 25 to about 45 wt % broad range; about 32 to about 38 wt % preferred range (b) Hydrogenated copolymer: about 0.1 to about 10 wt % broad range; about 0.5 to about 5 wt % preferred range (c) Reinforcement: about 5 to about 30 wt % broad range; about 10 to about 20 wt % preferred range (d) Filler: about 40 to about 60 wt % broad range, about 45 to about 55 wt % preferred range The above weight percentages are based upon the total amount of (a), (b), (c) and (d) in the composition. The hydrogenated copolymer is the previously described hydrogenated conjugated diene/monovinyl-substituted aromatic copolymer.

The broad ranges represent the ranges within which the composition should be confined in order to obtain good results. The preferred ranges are preferred because they define a composition possessing the physical, chemical and electrical properties best suited for its intended encapsulation purposes.

Although our invention is not limited thereto the viscosity of the composition used for encapsulation of active components should generally not exceed about 800 poise (as tested on a capillary rheometer at 650° F. and at a shear rate of 1000 $(sec)^{-1}$). Encapsulation of active electronic components with compositions having viscosities in excess of about 800 poise can cause damage to the components. It is then contemplated that the viscosity of the composition will generally range from about 150 to about 500 poise for active components other than very delicate components such as, for example, integrated circuits with wire leads. With respect to very delicate components such as, for example integrated circuits with wire leads, the viscosity of the encapsulation composition should be below about 150 poise (as tested on a capillary rheometer at 650° F. and at a shear rate of 1000 $(sec)^{-1}$). Encapsulation of integrated circuits with compositions any higher in viscosity can cause wire wash (i.e., breaking of the wires of the integrated circuit). It is contemplated that the viscosity of the composition for the encapsulation of such integrated circuits and the like will generally range from about 75 to about 150 poise.

Although viscosity of the composition depends on a number of factors, to obtain composition viscosities below about 800 poise the viscosity of the poly(arylene sulfide) should generally not exceed about 130 poise (as tested on a capillary rheometer at 650° F. and at a shear rate of 1000 $(sec)^{-1}$). It is contemplated that the viscosity of the poly(arylene sulfide) will, in most applications, range up to about 70 poise. To obtain composition viscosities within the desired range for delicate active components such as, for example, integrated circuits with wire leads, the viscosity of the poly(arylene sulfide) should generally be less than about 25 poise (as tested on a capillary rheometer at 650° F. and at a shear rate of 1000 $(sec)^{-1}$).

The reinforcements can be, for example, glass fibers or calcium silicate fibers.

The filler can be, for example, silica. The silica can be amorphous silica or crystalline silica. Silica is commercially available as a finely ground material having a relatively narrow particle size distribution ranging from about 1 to about 100 micrometers. Such commercial silica is typically made up of about 99.5 weight percent $SiO_2$ with $Al_2O_3$, $Fe_2O_3$, $Na_2O$ and $K_2O$ as the remaining components.

Other fillers include, for example, talc, glass, clay, mica calcium sulfate and calcium carbonate.

The preferred encapsulation composition for active components is prepared from:

(a) about 32 to about 38 wt % poly(phenylene sulfide) (viscosity less than about 130 poise as tested on a capillary rheometer at 650° F. and at a shear rate of about 1000 $(sec)^{-1}$), (b) about 0.5 to about 5 wt % hydrogenated isoprene/styrene block copolymer.

(c) about 10 to about 20 wt % glass fibers or calcium silicate fibers, and (d) about 45 to about 55 wt % silica.

If the viscosity of the poly(phenylene sulfide) is below about 25 poise (as tested on a capillary rheometer at 650° F. and at a shear rate of 1000 $(sec)^{-1}$) this composition is especially well suited for the encapsulation of integrated circuits with wire leads. Accordingly, integrated circuits encapsulated with this composition, represent one embodiment of my invention.

3. Compositions for the Encapsulation of Passive Components

Compositions used for the encapsulation of passive components can be prepared in accordance with the following weight percentages:

(a) Poly(arylene sulfide): about 25 to about 45 wt % broad range; about 32 to about 38 wt % preferred range (b) Hydrogenated copolymer: about 0.1 to about 10 wt % broad range; about 0.5 to about 5 wt % preferred range (c) Reinforcement: about 20 to about 50 wt % broad range; about 25 to about 45 wt % preferred range (d) Filler: about 18 to about 38 wt % broad range; about 23 to about 33 wt % preferred range The above weight percentages are based upon the total amount of (a), (b), (c) and (d) in the composition. The hydrogenated copolymer is the previously described hydrogenated conjugated diene/monovinyl-substituted aromatic copolymer.

The broad ranges represent the ranges within which the composition should be confined in order to obtain good results. The preferred ranges are preferred because they define a composition possessing the physical, chemical and electrical properties best suited for its intended encapsulation purposes.

Although our invention is not limited thereto the viscosity of the composition used for encapsulation of passive components should generally not exceed about 1200 poise (as tested on a capillary rheometer at 650° F. and at a shear rate of 1000 $(sec)^{-1}$). Encapsulation of passive electronic components with compositions having viscosities in excess of about 1200 poise can cause damage to the components. It is contemplated that the viscosity of the composition will generally range from about 500 to about 800 poise.

To obtain composition viscosities within the desired ranges the viscosity of the poly(arylene sulfide) should generally not exceed about 300 poise (as tested on a capillary rheometer at 650° F. and at a shear rate of 1000 (sec)$^{-1}$). It is contemplated that the viscosity of the poly(arylene sulfide) will generally from about 190 to about 300 poise.

The reinforcements can be, for example, glass fibers or calcium silicate fibers.

The preferred filler is talc because of its availability and ability to improve the dimensional stability, thermal conductivity and mechanical strength of the composition. In place of talc, or in combination with talc, other fillers can be used. Examples of such suitable fillers include, silica, calcium sulfate, calcium carbonate, clay, glass and mica. Calcium sulfate is especially useful in compositions used to encapsulate connectors.

The preferred encapsulation composition for passive components is prepared from:
(a) about 32 to about 38 wt % poly(phenylene sulfide) (viscosity less than about 300 poise as tested on a capillary rheometer at 650° F. and at a shear rate of about 1000 (sec)$^{-1}$),
(b) about 0.5 to about 5 wt % hydrogenated isoprene/styrene copolymer.
(c) about 25 to about 45 wt % glass fibers or calcium silicate fibers, and
(d) about 23 to about 33 wt % talc.

This composition is especially well suited for the encapsulation of capacitors. Accordingly, capacitors, encapsulated with this composition, represent an embodiment of my invention.

4. How to Make

The compositions of this invention can be made in accordance with any method wherein the poly(arylene sulfide), hydrogenated copolymer and other components (if any) are combined to form a mixture. Many suitable methods are well known to those of skill in the art. By way of example, the components of the composition can be mixed together at room temperature in a rotating drum blender or in an intensive mixer such as a Henschel mixer and then extrusion compounded at a temperature above about the melting point of the poly(arylene sulfide) to produce a uniform blend.

Once made, the composition can be used to encapsulate electronic components in accordance with any encapsulation method suitable for thermoplastic encapsulation compositions. Such methods are well known in the art. The compositions can be heated to a temperature of at least about the melting point of the poly(arylene sulfide) and then used to encapsulate electronic components. The composition can, for example, be introduced into an injection molding apparatus to produce a melt which is extruded into an injection mold wherein the electronic component to be encapsulated is positioned. Transfer molding processes are also acceptable.

The following examples are presented to facilitate disclosure of this invention and should not be interpreted to unduly limit its scope.

EXAMPLE I

This example describes the procedures used to prepare and evaluate poly(phenylene sulfide) compositions containing hydrogenated conjugated diene/monovinyl-substituted aromatic copolymer. The following ingredients were added to a Henschel mixer: 34 weight percent poly(phenylene sulfide) [Ryton TM Phillips Petroleum Co., having a flow rate of about 175 to 200 grams/10 min. as determined in accordance with test method ASTM D 1238, Procedure B modified to use a 345 g wt., 600° F. and a 0.0825 inch orifice]; 15 weight percent wollastonite (Wallastokup G 187 0.5); 49.2 weight percent silica (GP7I); 0.8 weight percent 3-mercaptopropyltrimethoxysilane (A-189, Union Carbide); and 1 weight percent Phil Ad TM VII (a hydrogenated 41 wt. % 1,3-butadiene/59 wt. % styrene linear random tapered block copolymer, having a weight average molecular weight ($M_w$) of about 70,000–80,000, U.S. Pat. No. 3,554,911). The ingredients were mixed until completely dispersed. The mixture was passed through a Buss-Condux cokneader extruder at 570°–600° F. and pelletized. The pelletized compounded product was injection molded using a 35 ton Arbrug molding machine (650° F. stock temperature, 275° F. mold temperature) into a 10 component copper alloy integrated circuit lead frame. Each integrated circuit (I.C.) was identified as a 7400 2-input quad NAND gate I.C. After encapsulation, each encapsulated portion measured about 0.5 inch×0.25 inch×0.125 inch. The encapsulated lead frame was cut and trimmed into the individual I.C.'s.

The integrated circuits were then placed on a 8 inch×10 inch Teflon board equipped with sockets to match those of the I.C.s. There was room for 50 circuits per board. The board also contained electric leads to each circuit. The assembled board was placed in an autoclave at 115° C. and about 10 psig. A 5 volt current was repeatedly turned on for 15 seconds and off for 75 seconds. Periodically the circuits were tested for failure. This failure test was conducted by removing the I.C. from the autoclave, cooling it to room temperature and placing it on another Teflon board consisting of individual zero force insertion sockets. The sockets were connected to an Idea Box (Global Specialties) which was equipped with a 5-volt power source and a signal generator. The Idea Box was also connected to a monitor (Oscilloscope, Model 222A, Hewlett Packard). Failure or passage was then determined by a pattern on the oscilloscope. If the pattern was the same as before the autoclave treatment, the I.C. was considered to have passed and was returned to the autoclave. After 96 or more hours, the I.C. was re-tested. Testing was repeated every 96 or more hours until 20 percent of the encapsulated devices failed. The test was referred to as the "Cycling Test". About 2000 hours of testing was required before 20 percent of the encapsulated devices failed. When the procedure was repeated using a poly(phenylene sulfide) composition without the hydrogenated copolymer the 20 percent failure level was reached in only 1000 hours.

Another test called "Constant Test" was used. This test was similar to the cycling test except the 5 volt current applied during the autoclave treatment remained constant rather than off-and-on. It required 2000 hours of autoclave treatment before 20 percent of the circuits encapsulated with the poly(phenylene sulfide) composition containing hydrogented copolymer failed. The composition without the copolymer required 2200 hours before the 20 percent failure was reached. The results are considered comparable. It required 2700 hours of autoclave treatment before 50 percent of the circuits encapsulated with the poly(phenylene sulfide) composition containing hydrogenated copolymer failed. The composition without the copolymer required 3000 hours before the 50 percent failure level was reached. Again the results are considered comparable.

A final test, referred to as "Device Electric Yield", was made on the encapsulated integrated circuits. This is a reliability test to determine how many circuits were successfully encapsulated. After the integrated circuits were encapsulated, cut and trimmed, they were tested by the oscilloscope method previously described to determine if encapsulation was successful. They were also visually inspected. The number of successful encapsulations was then recorded as the percent successful. Only those circuits successfully encapsulated were further used in the "Cycling and Constant" test. Ninety-eight percent of the I.C.'s encapsulated with the composition containing hydrogenated butadiene/styrene copolymer were considered successful. Only 89 percent of the I.C.'s encapsulated with the composition without the copolymer were considered successful. The results are presented in Table I for comparison.

TABLE I

Effect of Hydrogenated Butadiene/Styrene Copolymer on Electrical Properties of Poly(phenylene sulfide) Compositions

| Tests | PPS Composition | |
|---|---|---|
| | No Additive | 1 Wt. % Phil Ad VII |
| 1. Cycling Test: Time (hrs) for 20% of encapsulated devices to fail, alternating voltage, 5 volts | 1000 | 2000 |
| 2. Constant Test: | | |
| a. Time (hrs) for 20% of encapsulated devices to fail, constant voltage | 2200 | 2000 |
| b. Time (hrs) for 50% of encapsulated devices to fail, constant voltage | 3000 | 2700 |
| 3. Device Electric Yield, %: Percentage of successful circuit encapsulations | 89 | 98 |

EXAMPLE II

This example describes the preparation and evaluation of poly(phenylene sulfide) compositions containing different types of hydrogenated conjugated diene/monovinyl-substituted aromatic copolymers. The compositions prepared and tested are shown in Table II. These compositions were each used to encapsulate integrated circuits in the same manner as described in Example I. These encapsulated circuits were subsequently tested for encapsulation reliability (% Device Electric Yield) in the same manner as described in Example I. The results are listed in Table III where the data show that 86% of the integrated circuits were successfully encapsulated with the poly(phenylene sulfide) composition with the copolymer (Run 1). The data further show that 89% and 99% of the circuits were successfully encapsulated with the hydrogenated butadiene/styrene copolymer containing composition (Run 2) and the hydrogenated isoprene/styrene copolymer-containing composition (Run 3), respectively.

TABLE II

PPS/Hydrogenated Diene-Styrene Copolymers

| Ingredients | Weight Percent | | |
|---|---|---|---|
| | 1 | 2 | 3 |
| PPS[a] | 35.0 | 34.0 | 34.0 |
| Wollastonite[b] | 14.6 | 14.6 | 14.6 |
| Silica/silane[c] | 50.4 | 50.4 | 50.4 |
| Hydrogenated Copolymer: | | | |
| 41% Bd/59% Styrene[d] | — | 1.0 | — |
| 63% Isoprene/37% Styrene[e] | — | — | 1.0 |

[a]Poly(phenylene sulfide)
[b]Wollastokup G 187 0.5
[c]29.64 Kg Silica (GP7I) premixed with 600 g 3-mercaptopropyl-trimethoxysilane (A-189).
[d]Phil Ad VII, Phillips Petroleum Co., weight average molecular weight about 70,000–80,000.
[e]Kraton G-1701, AB type, Shell Chemical Co., 63% block isoprene/37% block styrene, weight average molecular weight about 109,000.

TABLE III

Effect of Additives in Poly(phenylene sulfide)[a] 28 Compositions on Device Electric Yield

| Additive | Device Electric Yield, % |
|---|---|
| Control: | |
| 1. None | 86 |
| Invention: | |
| 2. 1 wt. % Hydrogenated 41% Bd/59% Styrene[b] | 89 |
| 3. 1 wt. % Hydrogenated 63% Isoprene/37% Styrene | 99 |

[a]PPS composition: 34.0% PPS, 13.6% Wollastonite, 50.4% silica (containing 2.0 wt. % 3-mercaptopropyltrimethoxysilane).
[b]Phil Ad VII, U.S. Pat. No. 3,554,911, Phillips Petroleum Company, weight average molecular weight about 70,000–80,000.
[c]Kraton G-1701, AB type, Shell Chemical Company, weight average molecular weight about 109,000.

EXAMPLE III

This example compares the non-electrical performance properties of poly(phenylene sulfide) encapsulation compositions using a control composition and two compositions containing hydrogenated 1,3-butadiene/styrene copolymer. The control composition was prepared and tested as follows: To a Welex mixer was added fused silica (97.9 weight percent) and 3-aminopropyltriethoxysilane (2.1 weight percent) (A-187 Union Carbide). The components were mixed for a few minutes. This mixture was transferred to a fiber drum for dry mixing with other ingredients. The resultant composition was (based on the total composition): 35 weight percent poly(phenylene sulfide), 48.4 weight percent fused silica, 14.6 weight percent wollastonite, 1 weight percent carbon black and 1 weight percent of an organosilane (A-187). After tumbling for 5 to 10 minutes, the mixture was extruded through a 1.5 inch David Standard Extruder at 600° F., granulated in a chopper and passed through a New Britain Molding machine (barrel 600° F.) into a lead frame mold which contained a "dummy" copper alloy #638 lead frame similar to that described in Example I. Chips and lead terminals were not present in each I.C. but rather ⅛ inch tabs (2 on one side of each I.C. and one on the opposite side of each I.C.) were present. After molding, the tabs were embedded in the composition at various depths. In the first pack (I.C.), the tabs were embedded one-half way. In the second pack, the two tabs on top were embedded three-fourths of the way into the pack while the bottom tab was embedded one-fourth of the way. In the third pack, the reverse was made. Embedding was alternated in this manner throughout the 10-pack mold and, thus, gave representative samples for the adhesion test.

Each of the integrated circuit packs was cut away from the lead frame and trimmed. The embedded tabs were pulled out of the resin by an Instron Testing machine (Model 1125 using a 100 Kilonewtons load cell at a crosshead speed of 5 millimeters per minute and a chart speed of 50 millimeters per minute). There was obtained an average adhesion value of 128 Newtons. The process was repeated using a #194 copper alloy lead frame. An average adhesion value of 98 Newtons was obtained with the second alloy. These two values were used as controls.

The complete mixing, compounding, extruding and testing procedure was repeated except in addition to the ingredients disclosed there was incorporated at the dry mixing step 2 weight percent based on the total composition of either of two types of hydrogenated conjugated diene/monovinyl-substituted aromatic copolymer, namely, Phil Ad VII (hydrogenated 41 wt. % butadiene/59 wt. % styrene linear random tapered block copolymer, $M_w$=70,000–80,000, Phillips Petroleum Company) or Solprene 243S (hydrogenated 71 wt. % butadiene/29 wt. % styrene radial teleblock copolymer, $M_w/M_n$=55,000/52,000). The results listed in Table IV indicate that the presence of either hydrogenated copolymer greatly increased adhesion to the copper surfaces used in integrated circuits.

TABLE IV

Effect of Hydrogenated Butadiene/Styrene Aromatic Copolymers on the Adhesive Ability of Poly(phenylene sulfide) Compositions

| | PPS Composition[a] | | |
|---|---|---|---|
| Test | 0 Wt. % | 2 Wt. % Solprene Additive 243S[b] | 2 Wt. % Phil Ad VII[c] |
| 1. Adhesion to Copper Alloy #194, Newtons | 98 | 164 | 162 |
| 2. Adhesion to Copper Alloy #638, Newtons | 128 | 214 | 222 |

[a]35 Wt. % PPS, 48.4 fused silica, 14.6% Wollastonite, 1% carbon black, 1% A-187 organosilane.
[b]71% Bd/29% Sty hydrogenated radial teleblock copolymer, $M_w/M_n$ = 55,000/52,000.
[c]41% Bd/59% Sty hydrogenated random tapered block linear copolymer, $M_w$ = 70,000–80,000.

EXAMPLE IV

This example discloses other non-electrical performance properties of poly(phenylene sulfide) compositions containing varying amounts hydrogenated conjugated diene/monovinyl-substituted aromatic copolymer. The dry blending procedure of Example III was repeated. The resultant composition was extruded through a Davis standard extruder at 600° F., ground to a granular material, dried in an oven at 350° F. for 3 hours and then molded into bar specimens 8 inches × 1 inch × 0.125 inch using a New Britain molding machine (barrel 600° F., mold 275° F.). The results of the various tests are listed in Table V. The amount of hydrogenated copolymer was varied from 1 to 5 weight percent. The results indicate the presence of hydrogenated conjugated 1,3-butadiene/styrene copolymer improved many properties important for poly(phenylene sulfide) encapsulating compositions such as flexural strength, tensile break and unnotched Izod impact. For example, the unnotched Izod impact is increased from 67.4 J/M to over 90 J/M. Likewise, flexural strength is increased from 65.8 MPa to over 80 MPa and tensile break is increased from 42.7 MPa to over 56 MPa. Some properties are reduced by the presence of the copolymers such as flexural modulus from 17,370 MPa to less than 14,000 MPa and extrusion rate from 21.8 g/10 mins. to 16 or less g/10 mins. These reductions, however, are not considered detrimental for encapsulation composition performance.

TABLE V

Effect of Hydrogenated Butadiene/Styrene Copolymers on the Performance Properties of Poly(phenylene sulfide) Encapsulation Compositions

| | | PPS Composition[a] Plus Additive | | | | | |
|---|---|---|---|---|---|---|---|
| | Control | Solprene 243S[c] | | | Phil Ad VII[d] | | |
| Tests[b] | 0% | 1% | 2% | 5% | 1% | 2% | 5% |
| 1. Flexural Modulus, MPa | 17,370 | 16,403 | 16,048 | 13,745 | 17,088 | 16,020 | 13,605 |
| 2. Flexural Strength, MPa | 65.8 | 82.9 | 81.9 | 77.5 | 81.4 | 81.4 | 80.2 |
| 3. Tensile Break, MPa | 42.7 | 55.0 | 56.1 | 52.7 | 57.4 | 59.6 | 58.5 |
| 4. Izod Impact, J/M | | | | | | | |
| Notched | 49.0 | 49.9 | 52.0 | 49.8 | 48.5 | 52.8 | 42.5 |
| Unnotched | 67.4 | 75.7 | 82.8 | 90.4 | 84.8 | 92.7 | 92.0 |
| 5. 1270 Gram Load Extrusion Rate, g/10 min. | 21.8 | 15.7 | 14.4 | 11.9 | 15.5 | 15.6 | 16.0 |

[a]35 Wt. % PPS, 48.4% fused silica, 14.6% Wollastonite, 1% carbon black, 1% A-187 organosilane
[b]Test | Method
Flexural Modulus | ASTM D 790
Flexural Strength | ASTM D 790
Izod Impact Strength | ASTM D 1238
Extrusion Rate | ASTM D 1238
[c]71 Bd/29 Sty hydrogenated radial-teleblock copolymer, $M_w/M_n$ = 55,000/52,000
[d]41 Bd/59 Sty hydrogenated random tapered block linear copolymer, $M_w$ = 70,000–80,000.

We claim:

1. An article of manufacture comprising an electronic component encapsulated with a composition; wherein said composition comprises
    (a) poly(arylene sulfide) and
    (b) hydrogenated conjugated diene/monovinyl-substituted aromatic copolymer; wherein said copolymer consists essentially of conjugated diene monomer and monovinyl-substituted aromatic monomer.

2. An article of manufacture according to claim 1 wherein (a) is poly(phenylene sulfide).

3. An article of manufacture according to claim 1 wherein the copolymer of (b) is a random copolymer.

4. An article of manufacture according to claim 1 wherein the copolymer of (b) is a block copolymer.

5. An article of manufacture according to claim 4 wherein said copolymer is a linear block copolymer.

6. An article of manufacture according to claim 4 wherein said copolymer is a radial block copolymer.

7. An article of manufacture according to claim 4 wherein the monovinyl-substituted aromatic content of said copolymer is about 10 to about 90 weight percent based upon the total weight of said copolymer.

8. An article of manufacture according to claim 7 wherein said copolymer is characterized by at least about 80 percent aliphatic double bond hydrogenation.

9. An article of manufacture according to claim 8 wherein said copolymer is further characterized by less than about 25 percent aromatic double bond hydrogention.

10. An article of manufacture according to claim 7 wherein said copolymer is characterized by at least about 99 percent aliphatic double bond hydrogenation and by less than about 5 percent aromatic double bond hydrogenation.

11. An article of manufacture according to claim 10 wherein (a) is poly(phenylene sulfide).

12. An article of manufacture according to claim 7 wherein said copolymer has a weight average molecular weight of about 25,000 to about 350,000.

13. An article of manufacture according to claim 1 wherein said composition further comprises reinforcement.

14. An article of manufacture according to claim 13 wherein said reinforcement is glass fibers or calcium silicate fibers.

15. An article of manufacture according to claim 1 wherein said composition further comprises filler.

16. An article of manufacture according to claim 15 wherein said filler is silica, talc or calcium sulfate.

17. An article of manufacture according to claim 15 wherein said composition further comprises reinforcement; and wherein the amount of (b) in said composition is within the range of about 0.1 to about 10 weight percent based upon the total weight of (a), (b), said reinforcement and said filler.

18. An article of manufacture according to claim 17 wherein said range is about 0.5 to about 5 weight percent.

19. An article of manufacture according to claim 16 wherein said composition further comprises reinforcement selected from glass fibers and calcium silicate fibers.

20. An article of manufacture according to claim 1 wherein (b) is hydrogenated 1,3-butadiene/styrene block copolymer.

21. An article of manufacture according to claim 1 wherein (b) is hydrogenated isoprene/styrene block copolymer.

22. An article of manufacture according to claim 21 wherein the styrene content of said block copolymer is about 10 to about 90 weight percent based upon the total weight of said copolymer; wherein said block copolymer is characterized by at least about 80 percent aliphatic double bond hydrogenation and less than about 25 percent aromatic double bond hydrogenation; and wherein said hydrogenated block copolymer has a weight average molecular weight of about 25,000 to about 350,000.

23. An article of manufacture as recited in claim 1 wherein said electronic component is selected from the group consisting of
    capacitors
    resistors
    resistor networks
    integrated circuits
    transistors
    diodes
    triodes
    thyristors
    coils
    varistors
    connectors
    condensers
    transducers
    crystal oscillators
    fuses
    rectifiers
    power supplies, and
    microswitches.

24. An article of manufacture according to claim 1 wherein said composition further comprises an organosilane.

25. A composition for encapsulating an active electronic component comprising:
    (i) about 25 to about 45 weight percent poly(arylene sulfide),
    (ii) about 0.1 to about 10 weight percent hydrogenated conjugated diene/monovinyl-substituted aromatic copolymer wherein said copolymer consists essentially of conjugated diene monomer and monovinyl-substituted aromatic monomer,
    (iii) about 5 to about 30 weight percent reinforcement, and
    (iv) about 40 to about 60 weight percent filler;
    wherein said weight percentages are based upon the total weight of (i), (ii), (iii) and (iv); and wherein the viscosity of said composition does not exceed about 800 poise as tested on a capillary rheometer at 650° F. and at a shear rate of 1000 $(\sec)^{-1}$.

26. A composition in accordance with claim 25 wherein said filler is silica; and wherein said reinforcement is glass fibers or calcium silicate fibers.

27. A composition in accordance with claim 26 wherein (i) is poly(phenylene sulfide).

28. A composition according to claim 27 wherein (ii) is a hydrogenated isoprene/styrene block copolymer having a styrene content of about 10 to about 90 weight percent based upon the total weight of said copolymer is characterized by at least about 80 percent aliphatic double bond hydrogenation and less than about 25 percent aromatic double bond hydrogenation; and wherein said hydrogenated copolymer has a weight average molecular weight of about 25,000 to about 350,000.

29. A composition in accordance with claim 25 wherein said viscosity of said composition does not exceed about 150 poise.

30. A composition according to claim 25 further comprising an organosilane.

31. An electronic component encapsulated with a composition comprising:
    (i) about 25 to about 45 weight percent poly(arylene sulfide),
    (ii) about 0.1 to about 10 weight percent hydrogenated conjugated diene/monovinyl-substituted aromatic copolymer,
    (iii) about 5 to about 30 weight percent reinforcement, and
    (iv) about 40 to about 60 weight percent filler;
    wherein said weight percentages are based upon the total weight of (i), (ii), (iii) and (iv); and wherein the viscosity of said composition does not exceed about 800 poise as tested on a capillary rheometer at 650° F. and at a shear rate of 1000 $(\sec)^{-1}$; wherein said copolymer consists essentially of conjugated diene monomer and monovinyl-substituted aromatic monomer.

32. An electric component as recited in claim 31 wherein (i) is poly(phenylene sulfide); wherein (iii) is glass fibers or calcium silicate fibers; and wherein (iv) is silica.

33. An electronic component as recited in claim 32 wherein (ii) is a hydrogenated isoprene/styrene block copolymer having a styrene content of about 10 to about 90 weight percent based upon the total weight of said copolymer; wherein said copolymer is characterized by at least about 80 percent aliphatic double bond hydrogenation and less than about 25 percent aromatic double bond hydrogenation; and wherein said hydrogenated copolymer has a weight average molecular weight of about 25,000 to about 350,000.

34. An electronic component as recited in claim 31 wherein said electronic component is an integrated circuit with wire leads and wherein said viscosity of said composition does not exceed about 150 poise.

35. A composition for encapsulating passive electronic components comprising:
(i) about 25 to about 45 weight percent poly(arylene sulfide),
(ii) about 0.1 to about 10 weight percent hydrogenated conjugated diene/monovinyl-substituted aromatic copolymer wherein said copolymer consists essentially of conjugated diene monomer and monovinyl-substituted aromatic monomer,
(iii) about 20 to about 50 weight percent reinforcement, and
(iv) about 18 to about 38 weight percent filler; wherein said weight percentages are based upon the total weight of (i), (ii), (iii) and (iv); and wherein the viscosity of said composition does not exceed about 1200 poise as tested on a capillary rheometer at 650° F. and at a shear of 1000 $(sec)^{-1}$.

36. A composition in accordance with claim 35 wherein said filler is selected from talc and calcium sulfate.

37. A composition in accordance with claim 36 wherein said reinforcement is selected from glass fibers and calcium silicate fibers.

38. A composition in accordance with claim 35 wherein (i) is poly(phenylene sulfide).

39. A composition according to claim 35 wherein (ii) is a hydrogenated isoprene/styrene block copolymer having a styrene content of about 10 to about 90 weight percent based upon the total weight of said copolymer; wherein said copolymer is characterized by at least about 80 percent aliphatic double bond hydrogenation and less than about 25 percent aromatic double bond hydrogenation; and wherein said hydrogenated copolymer has a weight average molecular weight of about 25,000 to about 350,000.

40. A composition in accordance with claim 37 wherein said filler is talc.

41. A composition in accordance with claim 37 wherein said filler is calcium sulfate.

42. A composition in accordance with claim 35 further comprising an organosilane.

43. An electronic component encapsulated with a composition comprising:
(i) about 25 to about 45 weight percent poly(amylene sulfide),
(ii) about 0.1 to about 10 weight percent hydrogenated conjugated diene/monovinyl-substituted aromatic copolymer,
(iii) about 20 to about 50 weight percent reinforcement, and
(iv) about 18 to about 38 weight percent filler; wherein said weight percentages are based upon the total weight of (i), (ii), (iii), and (iv); and wherein the viscosity of said composition does not exceed about 1200 poise as tested on a capillary rheometer at 650° F. and at a shear rate of 1000 $(sec)^{-1}$; wherein said copolymer consists essentially of conjugated diene monomer and monovinyl-substituted aromatic monomer.

44. An electronic component as recited in claim 43 wherein (i) is poly(phenylene sulfide).

45. An electronic component as recited in claim 43 wherein (ii) is a hydrogenated isoprene/styrene block copolymer having a styrene content of about 10 to about 90 weight percent based upon the total weight of said copolymer; wherein said copolymer is characterized by at least about 80 percent aliphatic double bond hydrogenation and less than about 25 percent aromatic double bond hydrogenation; and wherein said hydrogenated copolymer has a weight average molecular weight of about 25,000 to about 350,000.

46. An electronic component as recited in claim 43 wherein said electronic component is a capacitor; wherein said reinforcement is selected from glass fibers and calcium silicate fibers; and wherein said filler is talc.

47. An electronic component as recited in claim 43 wherein said electronic component is a connector; wherein said reinforcement is selected from glass fibers and calcium silicate fibers; and wherein said filler is calcium sulfate.

48. A method comprising:
(a) producing mixing comprising (i) poly(arylene sulfide) and (ii) hydrogenated conjugated diene/monovinyl-substituted aromatic copolymer wherein said copolymer consists essentially of conjugated diene monomer and monovinyl-substituted aromatic momomer,
(b) heating said mixture to a temperature of at least about the melting point of said poly(arylene sulfide), and
(c) encapsulating an electronic component with said mixture.

49. A method as recited in claim 48 wherein said poly(arylene sulfide) is poly(phenylene sulfide).

50. A method as recited in claim 48 wherein said mixture produced in (a) further comprises (iii) reinforcement and (iv) filler.

51. A method as recited in claim 48 wherein injection molding is used to encapsulate said electronic component.

* * * * *